(12) United States Patent
Chen et al.

(10) Patent No.: US 7,737,538 B2
(45) Date of Patent: Jun. 15, 2010

(54) SEMICONDUCTOR PACKAGE (75) Inventors: Chao-Chen Chen, Hsinchu (TW); Lin-Gi Yang, Hsinchu (TW); Chia-Chi Chou, Hsinchu (TW); Shih-Chieh Teng, Kaohsiung (TW)

(73) Assignee: VisEra Technologies Company Limited, Hsinchu (TW)

( * ) Notice: Subject to any disclaimer, the term of this patent is extended or adjusted under 35 U.S.C. 154(b) by 54 days.

(21) Appl. No.: 11/979,809

(22) Filed: Nov. 8, 2007

(65) Prior Publication Data
US 2009/0121303 A1 May 14, 2009

(51) Int. Cl.
*H01L 23/495* (2006.01)
*H01L 21/00* (2006.01)

(52) U.S. Cl. .......................... 257/670; 257/678; 438/48
(58) Field of Classification Search ................. 257/678, 257/670; 438/48
See application file for complete search history.

(56) References Cited

U.S. PATENT DOCUMENTS

| | | | |
|---|---|---|---|
| 6,400,004 B1 * | 6/2002 | Fan et al. .................... 257/666 |
| 6,489,668 B1 * | 12/2002 | Oda et al. .................... 257/675 |
| 6,528,869 B1 * | 3/2003 | Glenn et al. ................. 257/678 |
| 6,909,168 B2 * | 6/2005 | Minamio et al. ............ 257/670 |
| 7,005,720 B2 * | 2/2006 | Huang et al. ................. 257/433 |
| 2004/0238923 A1 * | 12/2004 | Lee et al. ..................... 257/670 |

FOREIGN PATENT DOCUMENTS

| | | |
|---|---|---|
| CN | 2598149 | 1/2004 |
| CN | 1921078 | 2/2007 |

* cited by examiner

*Primary Examiner*—Howard Weiss
*Assistant Examiner*—Steven H Rao
(74) *Attorney, Agent, or Firm*—Muncy, Geissler, Olds & Lowe, PLLC (57) ABSTRACT

A semiconductor package. The semiconductor package of the invention comprises: a substrate comprising at least one exposed area with photosensitive devices; a cover for isolating the exposed area from the external atmosphere, wherein one of either the substrate or the cover is a base, and the other is a top structure; and a dam formed on the base to form a cavity, wherein the top of the dam has a recess, the dam is attached the top structure by an adhesive, and the cavity corresponds to the exposed area.

11 Claims, 7 Drawing Sheets

FIG. 1

PRIOR ART

SEMICONDUCTOR PACKAGE

BACKGROUND OF THE INVENTION

1. Field of the Invention

The present invention relates to a semiconductor packages, and in particular relates to a photosensitive semiconductor package.

2. Description of the Related Art

In conventional semiconductor packaging, a semiconductor chip is encapsulated with an opaque encapsulant for preventing the chip from being damaged by external contaminants and moisture, as well as protection against damage from external impact. However, in respect to a photosensitive semiconductor chip for use in an electronic device such as a CMOS image sensor, the chip requires a photosensitive side to receive external light. Therefore, a different method for packaging such a photosensitive semiconductor chip is adopted, as compared to the foregoing conventional semiconductor packaging method.

Figure 1:
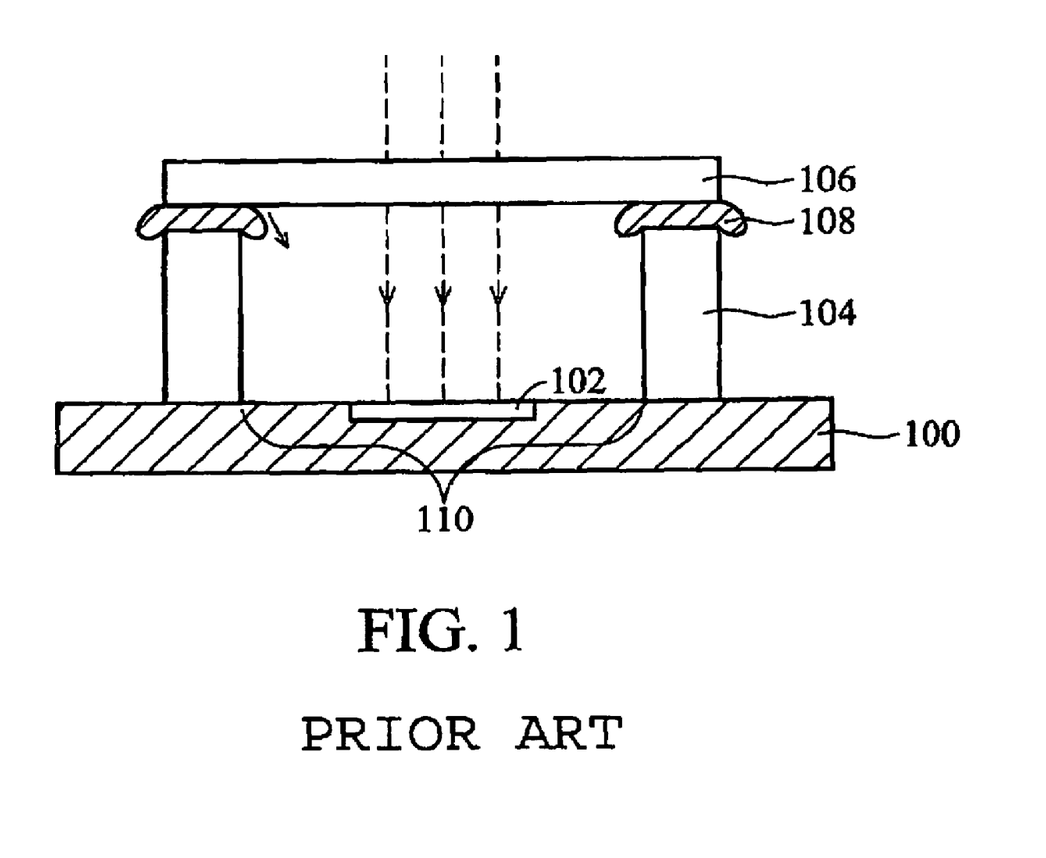
FIG. 1 is a cross-sectional view showing the adhesive between a lid and a top of an encapsulant of a conventional photosensitive semiconductor package.

In conventional semiconductor packaging manufacturing methods, there have been several patents regarding the packaging of photosensitive semiconductor chips. A common semiconductor package for accommodating a photosensitive semiconductor chip is illustrated in FIG. 1, comprising: a wafer 100 defined having a photosensitive device 102; an dam 104 formed on the wafer 100 with a cavity for exposing an expose area 110; and a transparent cover 106 attached to a top of the dam 104, wherein the transparent cover 106 is positioned right above the photosensitive chip 102.

Generally, a commercially available transparent cover (e.g. a glass slice) is applied with an epoxy resin adhesive at positions attached to the top of the packing layer. After heating and applying pressure, the adhesive melts and solidifies to firmly attach the lid onto the top of the dam.

However, compression between the transparent cover 106 and the top of dam 104 easily results in leakage or loss of the adhesive 108, because the top of the dam 104 is flat. Additionally, if the adhesive flows over the dam to the expose area 110, the leaked adhesive will lead to contamination of the photosensitive chip and thus, manufacturing yield lost. Thus, to obtain an excellent semiconductor package, a novel packaging method and package structure are required for photosensitive semiconductor devices.

BRIEF SUMMARY OF INVENTION

The invention provides a semiconductor package, comprising: a substrate comprising at least one exposed area with photosensitive devices; a cover for isolating the exposed area from the external atmosphere, wherein one of either the substrate or the cover is a base, and the other is a top structure; and a dam formed on the base to form a cavity, wherein the top of the dam has a recess, the dam is attached to the top structure by an adhesive, and a cavity corresponds to the exposed area.

The invention provides another semiconductor package, comprising: a substrate comprising at least one exposed area with photosensitive devices; a cover for isolating the exposed area from the external atmosphere, wherein one of either the substrate or the cover is a base, and the other is a top structure; a dam formed on the base to form a cavity; and a wall on the base surrounded by the dam, wherein the dam is attached the top structure by an adhesive, a cavity corresponds to the exposed area, and a wall surrounds the exposed area.

The invention further provides a method for manufacturing a semiconductor package, comprising: providing a base; forming a dam on the substrate to form a cavity; forming a recess on the surface of the dam; assembling a top structure on the dam using an adhesive, wherein one of either the base or the top structure is a substrate comprising at least one exposed area with photosensitive devices, and the other is a cover; and a cavity corresponding to the exposed area.

In one embodiment, the base is the substrate. In another embodiment, the base is the top structure.

A detailed description is given in the following embodiments with reference to the accompanying drawings.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 2 and 3 illustrate embodiments of methods for forming a photosensitive semiconductor package according to the invention. It should be understood that the drawings herein are made in simplicity, and are utilized for illustrating associated elements related to the invention. In practical usage however, the semiconductor package is more complexly structured.

Figure 2A:
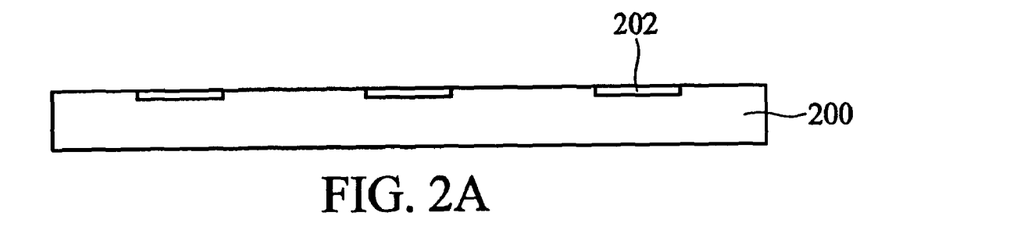
FIGS. 2A-2D are schematic diagrams showing the steps involved in fabricating a photosensitive semiconductor package of the invention.

FIGS. 2A to 2D simplified illustrate a first embodiment of a photosensitive semiconductor package of the invention. FIG. 2A illustrates a substrate 200, typically having at least one metal layer and optomechanical or optoelectronic devices 202 formed thereon. In one embodiment, substrate 200 is a silicon wafer with photosensitive chips.

Figure 2B:
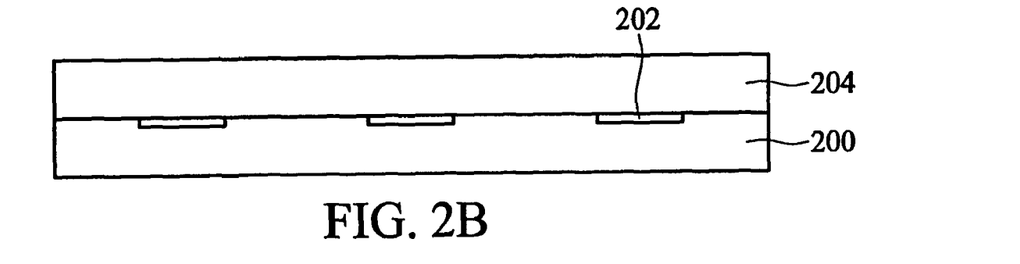

FIG. 2B illustrates a photoresist layer 204 coated on the substrate 200. The photoresist layer 204 is a photosensitive composition, preferably, a negative photoresist (e.g., Kodak KTFR), a positive photoresist, such as Azoplate AZ 1350, sold by the Shipley Co., Newton, Mass., or an epoxy based photoresist such as SU-8 photoresist. The method for coating the photoresist layer includes various coating methods, such as a spin coating method, a dip coating method, a curtain flow coating method, a roll coating method, a spray coating method or a cast coating method. In one embodiment, the method for coating the photoresist layer may include PVD methods (physical vapor deposition methods) such as a vacuum deposition method, an ion plating method or a sputtering method.

Figure 2C:
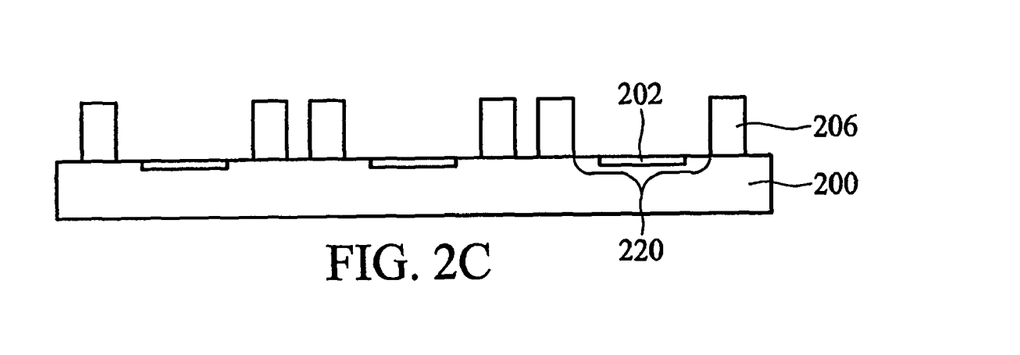

As shown in FIG. 2C, photoresist layer 204 is exposed via a mask to define dam(s) 206. In the embodiment, a photosensitive layer 204 is first applied uniformly to the surface of a substrate such as a silicon wafer by use of a spinner followed by drying to form the photoresist layer. Next, the photoresist layer is then exposed to ultraviolet or far ultraviolet light through a photomask bearing a desired pattern, and developed with a developer solution so that the photoresist layer in the unexposed areas is dissolved to leave a negatively patterned photoresist layer with high fidelity of the pattern to the pattern on the photo mask. Dam 206 is formed on the substrate to form a cavity for exposing an exposed area 220, and the optoelectronic devices 202 is located inside the exposed area 220.

Figure 2D:
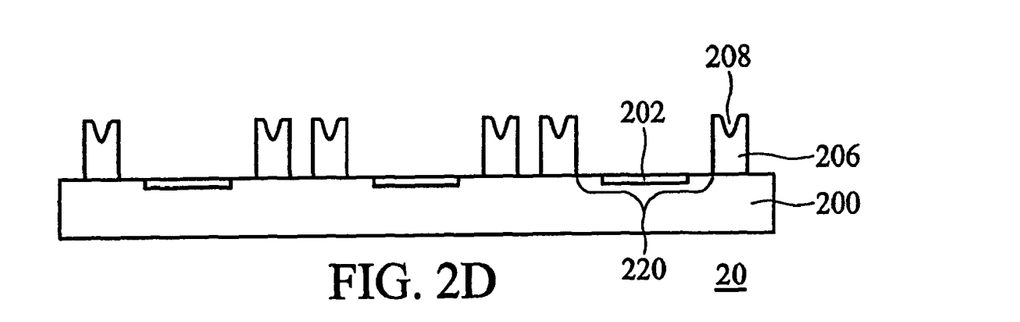
Figure 2E:
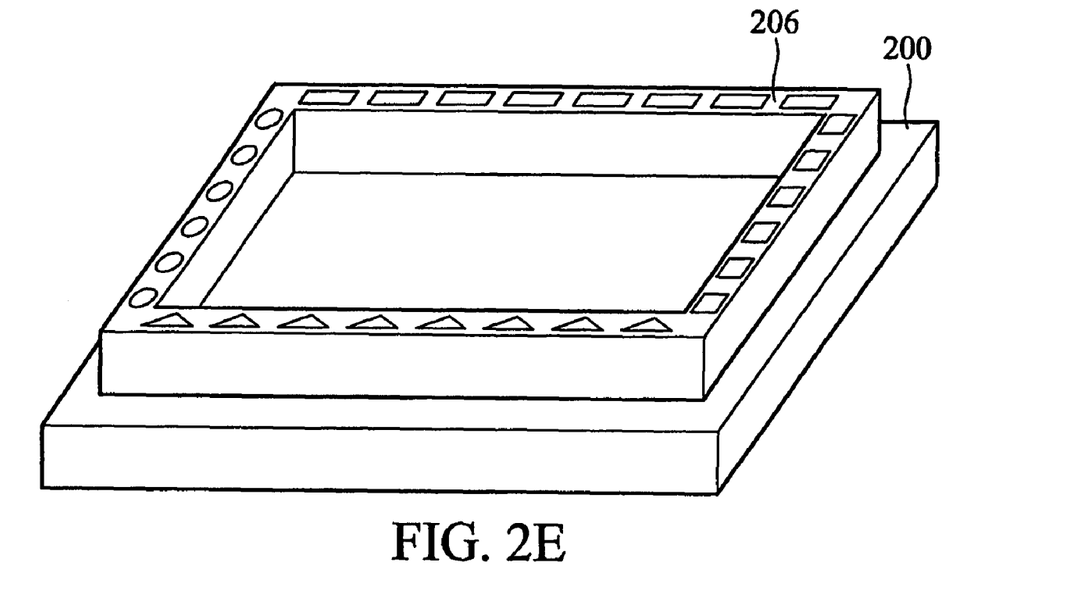
FIG. 2E shows various shapes of the recess of the invention.

FIG. 2D illustrates the formation of recess 208 on the top surface of dam 206. Recesses 208 can be formed by etching, lithography, photolithography, or other commonly used methods such as imprint and the like. In one embodiment, dam 206 and recess 208 can be formed by using the same photomask and process. In another embodiment, recess 208 can be formed by using an additional photomask and lithography process. Recess 208 has a depth of about 4 to 35 µm, preferably, about 10 to 20 µm. In one embodiment, recess 208 extends to the surface of substrate 200. Referring to FIG. 2E, shapes of recess 208 include, but are not limited to, circular, square, oblong, triangle, polygon or other suitable shape. One skilled in the art can form various recess 208 shapes according to suitable methods. Alternatively, recess 208 can also be variably structured as a square, curve, V-shape, groove, or a recess made with protruding portions at a bottom thereof. The number or the density of recess 208 are not limited, preferably, 0.7 per mm$^2$, or 0.8 to 0.85 per mm$^2$. The number or density of the recess 208 is associated with the prevention of the adhesive loss. For example, the prevention of the adhesive lost can be improved by increasing the number of recess 208.

Figure 2F:
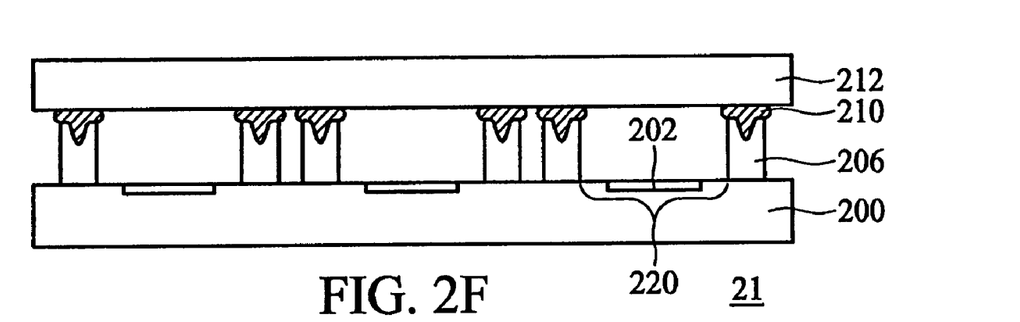
FIG. 2F is a cross session of the semiconductor package showing a wall formed on the substrate according to an embodiment of the invention.

As shown in FIG. 2F, cover 212 is completely attached to the top of dam 206 by adhesive 210 to form structure 21. When cover 212 is attach to the top of dam 206, recess 208 can temporarily retain excessive adhesive 210 therein in facility with recess 208 that effectively direct the adhesive flow toward recess 208, so that undesirable adhesive loss and adhesive flash can be both prevented. Furthermore, recess 208 can prevent adhesive 210 flowing to the exposed area 220. The adhesive can be a conventional attaching adhesive, such as an epoxy, acrylic, silicone or polyimide material. Alternately, the adhesive can be a polymer tape, such as "KAPTON" tape manufactured by DuPont. The cover may be any transparent material which has sufficient pervious and impact resistance, such as glass. Cover 212 may be molded in a conventional manner from any of the materials mentioned and others as well.

Figure 2G:
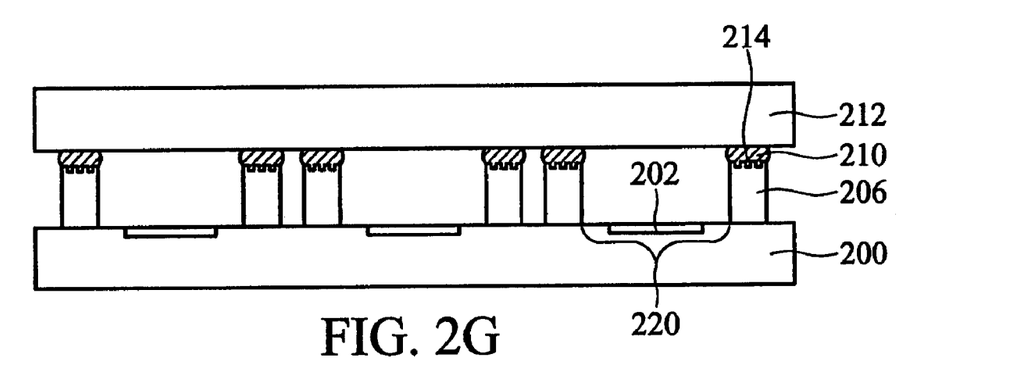
FIG. 2G is a cross session of the semiconductor package showing a wall formed on the substrate according to another embodiment of the invention.

FIG. 2G illustrates another embodiment of the invention. As shown in FIG. 2G, plural recess 214 is formed on the top surface of dam 206. The plural recess 214 can provide relatively larger surface area for accommodating adhesive 210. Thus, the contact area is increased between the top of dam 206 and the adhesive 210, resulting in effective improvement of the bonding between cover 212 and dam 206. Similarly as mentioned previously, the shape, number, and density of the cavity are not limited.

Figure 2H:
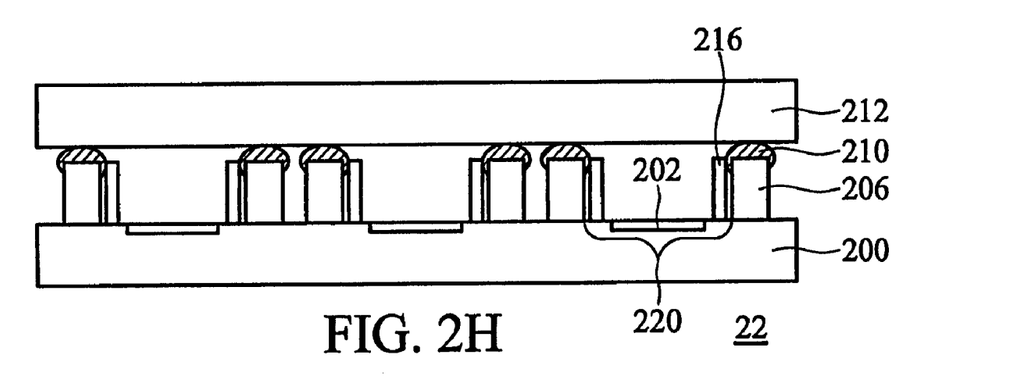
FIG. 2H is a cross session of the semiconductor package showing a wall formed on the substrate according to yet another embodiment of the invention.
Figure 2I:
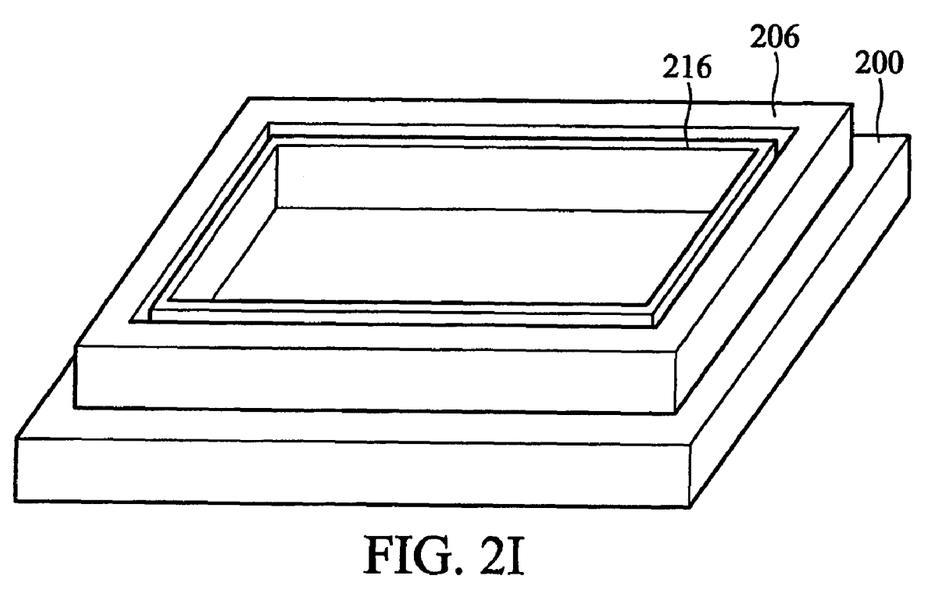
FIG. 2I is a three dimensional illustration of the structure in FIG. 2H.

FIG. 2H illustrates yet another embodiment of the invention. As shown in FIG. 2H, wall 216 is located between dam 206 and optoelectronic device 202, and optoelectronic device 202 is surrounded by wall 216. Wall 216 can be formed by etching, lithography, photolithography, deposition, or other commonly used methods such as imprint and the like. In one embodiment, wall 216 and dam 206 can be formed by using same photomask and process. In another embodiment, recess 208 can be formed by an additional photomask and lithography process. The height of wall 216 exceeds 10 µm, preferably, about 30 to 40 µm. In one embodiment, wall 216 and dam 206 have a same height. The distance between dam 206 and wall 216 is about 30 to 100 µm, preferably, about 40 to 50 µm. Wall 216 can completely prevents excessive adhesive from flowing into the sensing portion, thus, protecting the sensing portion. The material of wall 216 can be a photoresist material. Preferably, the wall 216 and dam 206 have the same photoresist material. Alternative, the material of wall 216 can be an oxide, silicon nitride, silicon oxynitride and/or other dielectric materials. In another embodiment, the wall can be a metal, such as Pd, Pt, Cu, Ag, Au, In, Sn, Pb, P, As, Sb or Ni. The three dimensional image of structure 22 in shown in FIG. 2I. Alternatively, the top surface of dam 206 also has recesses (not shown).

The invention further provides an alternative method for forming a semiconductor package structure as shown in FIG. 3. The steps illustrated in FIGS. 3A-3E are similar as those illustrated in FIGS. 2A-2E, except that substrate 200 and cover 300 are exchange in FIGS. 3A-3E. That is, a transparent cover 300 is provided, a photoresist material 302 is formed on transparent substrate 300, a dam(s) 304 is formed by lithography process, and a recess 306 is formed on the top surface of dam 304.

Figure 3A:
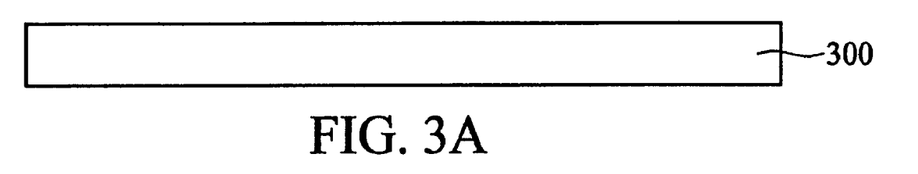
FIGS. 3A-3E are schematic diagrams showing the steps involved in fabricating another photosensitive semiconductor package of the invention.
Figure 3B:
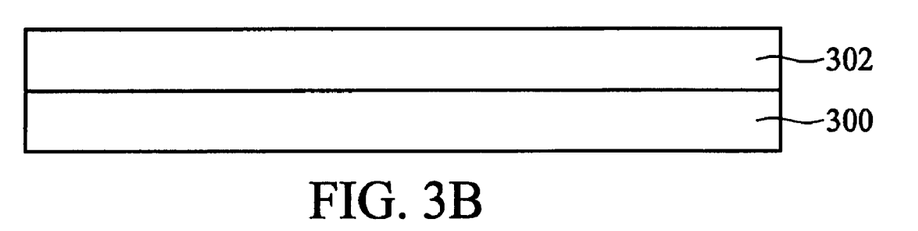
Figure 3C:
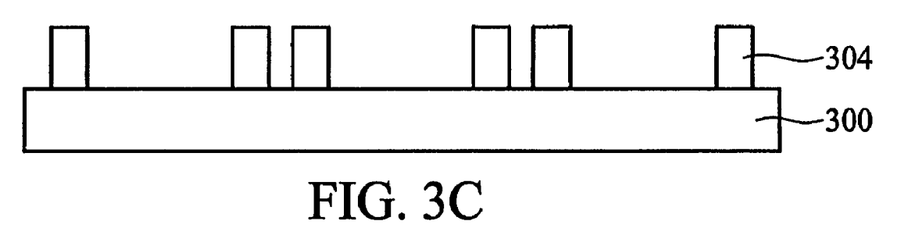
Figure 3D:
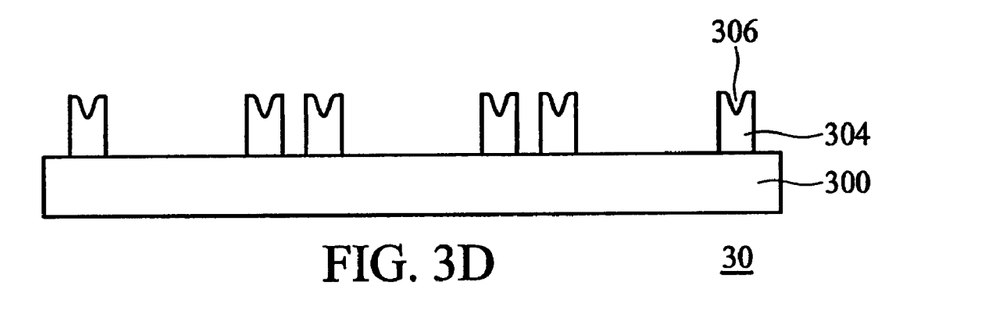
Figure 3E:
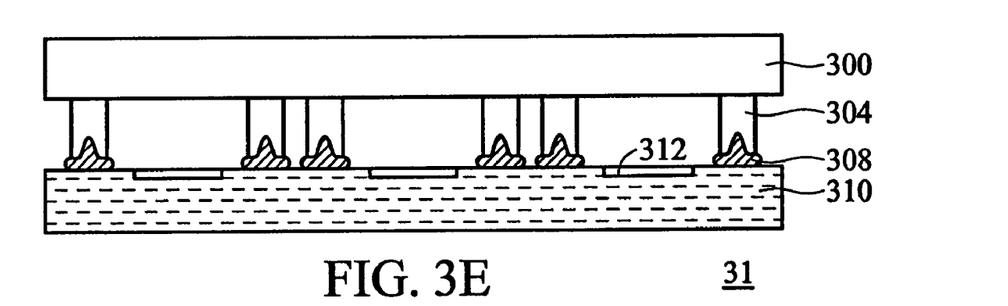

FIG. 3E illustrates another embodiment of a semiconductor package of the invention. Semiconductor package 31 comprises wafer 310 with a optoelectronic devices 312; a packaging structure 30 (shown in FIG. 3D) comprising dam 304 and transparent cover 300 with a cavity for exposing a chip attach region, wherein a surface of the dam 304 relative to the wafer 310 has a recess 306; and dam 304 applied with an adhesive 308 at a position corresponding to the top surface of dam 304, so as to firmly attach the packaging structure 30 to wafer 310 with photosensitive device 312. As mentioned in previous embodiments of the invention, the excessive adhesive can be retained in recess 306, so that undesirable adhesive loss can be prevented. The shapes of recess 306 includes, but are not limited to, circular, square, oblong, triangle, polygon or other suitable shape. In one embodiment, recess 306 can also be variably structured as a square, V-shape, groove, or a recess made with protruding portions at a bottom thereof. The number and the density of recess 306 are not limited, for example, about 0.7 per mm$^2$, or about 0.8 to 0.85 per mm$^2$. The depth of recess 306 is about 4 to 35 µm, preferably, about 10 to 20 µm. In one embodiment, the recess extends to the surface of cover 300.

Figure 3F:
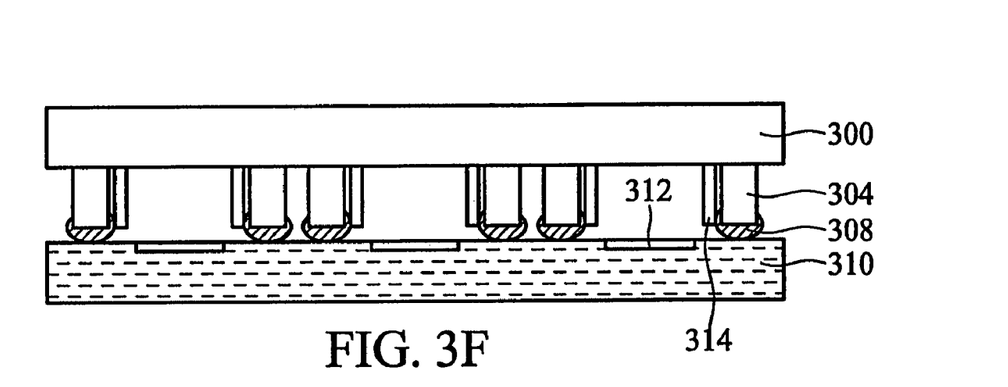
FIG. 3F is a cross session of the semiconductor package showing a wall formed on the substrate according to yet a further embodiment of the invention.

FIG. 3F illustrates yet a further embodiment of the invention. As shown in FIG. 3F, wall 314 is located between dam 304 and optoelectronic device 312, and optoelectronic device 312 is surrounded by wall 314.

By forming the recess or wall, the embodiments of the invention result in a reliable semiconductor package. The recess or wall of the invention significantly reduces leakage or lost of the adhesive, thus, decreasing packaging error and obtaining an excellent semiconductor package appearance.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:
   a substrate comprising at least one exposed area with photosensitive devices;
   a cover for isolating the exposed area from the external atmosphere, wherein one of either the substrate or the cover is a base and the other is a top structure;
   a dam formed on the base to form a cavity, wherein the dam is attached to the top structure by an adhesive, and the cavity correspond to the exposed area; and
   a wall on the base surrounded by the dam, wherein the wall is separate from the dam and surrounds the exposed area.

2. The semiconductor package as claimed in claim 1, wherein the base is the substrate, and the top structure is the cover.

3. The semiconductor package as claimed in claim 1, wherein the base is the cover, and the top structure is the substrate.

4. The semiconductor package as claimed in claim 1, wherein the height of the wall exceeds 10 μm.

5. The semiconductor package as claimed in claim 1, wherein the wall and the dam have a same height.

6. The semiconductor package as claimed in claim 1, wherein the wall is a photoresist layer.

7. The semiconductor package as claimed in claim 1, wherein the cover is a transparent layer.

8. The semiconductor package as claimed in claim 1, wherein the cover is a glass.

9. A method for manufacturing a semiconductor package, comprising:
   providing a base;
   forming a dam on the substrate to form a cavity;
   forming a wall on the base surrounded by the dam, wherein the wall is separated from the dam; and
   assembling a top structure on the dam using an adhesive, wherein one of either the base or the top structure is a substrate comprising at least one exposed area with photosensitive devices, and the other is a cover, and the cavity corresponds to the exposed area.

10. The method as claimed in claim 9, wherein the base is the substrate, and the top structure is the cover.

11. The method as claimed in claim 9, wherein the base is the cover, and the top structure is the substrate.

* * * * *